(12) United States Patent
Ahn et al.

(10) Patent No.: US 11,653,464 B2
(45) Date of Patent: May 16, 2023

(54) COVER WINDOW, DISPLAY DEVICE INCLUDING THE SAME, AND METHOD OF MANUFACTURING THE DISPLAY DEVICE

(71) Applicant: Samsung Display Co., Ltd., Yongin-si (KR)

(72) Inventors: Sungsang Ahn, Hwaseong-si (KR); Minsang Koo, Seongnam-si (KR); Seongjin Hwang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 84 days.

(21) Appl. No.: 17/155,011

(22) Filed: Jan. 21, 2021

(65) Prior Publication Data
US 2021/0360809 A1 Nov. 18, 2021

(30) Foreign Application Priority Data

May 12, 2020 (KR) .......................... 10-2020-0056352

(51) Int. Cl.
*H05K 5/00* (2006.01)
*H05K 5/03* (2006.01)
*G02B 5/00* (2006.01)
*G02B 1/14* (2015.01)

(52) U.S. Cl.
CPC ............ *H05K 5/03* (2013.01); *G02B 1/14* (2015.01); *G02B 5/003* (2013.01); *H05K 5/0017* (2013.01)

(58) Field of Classification Search
USPC ......................................................... 361/807
See application file for complete search history.

(56) References Cited

U.S. PATENT DOCUMENTS

| | | |
|---|---|---|
| 2014/0030496 A1 | 1/2014 | Oh et al. |
| 2016/0372701 A1* | 12/2016 | Kwon ................... H01L 51/524 |
| 2019/0181389 A1* | 6/2019 | Joo ....................... H01L 51/5256 |
| 2019/0300424 A1 | 10/2019 | Jeong et al. |
| 2019/0377386 A1* | 12/2019 | Heo ........................ B32B 17/06 |

FOREIGN PATENT DOCUMENTS

| | | |
|---|---|---|
| JP | 2016102050 | 6/2016 |
| KR | 10-2014-0033898 | 3/2014 |
| KR | 10-1990537 | 6/2019 |
| KR | 10-2019-0115147 | 10/2019 |
| KR | 10-2019-0141069 | 12/2019 |
| KR | 10-2068729 | 1/2020 |

* cited by examiner

*Primary Examiner* — Hung S. Bui
(74) *Attorney, Agent, or Firm* — H.C. Park & Associates, PLC (57) ABSTRACT

A cover window includes a glass substrate, a polymer film disposed on the glass substrate, an adhesive layer disposed between the glass substrate and the polymer film, a protective layer covering the adhesive layer and the glass substrate, and a light blocking portion disposed on at least one of the glass substrate and the polymer film. The protective layer covers a side surface of the adhesive layer, a side surface of the glass substrate, and one surface of the glass substrate. The cover window has improved strength and reliability.

20 Claims, 10 Drawing Sheets

COVER WINDOW, DISPLAY DEVICE INCLUDING THE SAME, AND METHOD OF MANUFACTURING THE DISPLAY DEVICE

CROSS-REFERENCE TO RELATED APPLICATION

This application claims priority from and the benefit of Korean Patent Application No. 10-2020-0056352, filed on May 12, 2020, which is hereby incorporated by reference for all purposes as if fully set forth herein.

BACKGROUND

Field

Exemplary implementations of the invention relate generally to a display device and, more specifically, to a cover window including a protective layer, a display device including the cover window, and a method of manufacturing the display device.

Discussion of the Background

A display device displays various images through a display screen to provide a user with information. In general, the display device displays the information in an allocated screen area. In recent years, flexible display devices including a flexible display panel that is foldable or bendable are being developed. Different from a rigid display device, the flexible display device is foldable, rollable, or bendable. The flexible display device, which is capable of being transformed into various shapes, is easy to carry and improves a user's convenience regardless of the original size of its display screen.

A cover window applied to the flexible display device includes a thin glass substrate, and a coating process is performed on the glass substrate to improve the strength of the glass substrate.

The above information disclosed in this Background section is only for understanding of the background of the inventive concepts, and, therefore, it may contain information that does not constitute prior art.

SUMMARY

Applicant recognized that when the coating process of the cover window is performed to the flexible display device, a coating solution permeates into a front surface of the glass substrate which displays images.

Cover windows constructed according to the principles and exemplary implementations of the invention are capable of improving reliability, and having the transparent property of a glass substrate and the flexible property of a polymer film by including the glass substrate, an adhesive layer, the polymer film, and a protective layer.

Display devices including the cover windows constructed according to the principles and exemplary implementations of the invention are capable of improving strength on the front surface thereof since the polymer film of the cover window is disposed on the front surface thereof.

Methods of manufacturing the display devices according to the principles and exemplary implementations of the invention are capable of improving the manufacturing yield of the cover window because the coating solution can be prevented from permeating into the front surface of the glass substrate.

Additional features of the inventive concepts will be set forth in the description which follows, and in part will be apparent from the description, or may be learned by practice of the inventive concepts.

According to an aspect of the invention, a cover window includes: a glass substrate, a polymer film disposed on the glass substrate, an adhesive layer disposed between the glass substrate and the polymer film, a protective layer covering a side surface of the adhesive layer, a side surface of the glass substrate, and one surface of the glass substrate, and a light blocking portion disposed on at least one of the glass substrate and the polymer film.

The adhesive layer may entirely overlap the glass substrate, and the adhesive layer has an area equal to or smaller than an area of the glass substrate in a plan.

Each of the adhesive layer and the glass substrate may have a quadrangular shape in a plan, the adhesive layer may have an area equal to or smaller than an area of the glass substrate in the plan, and a difference in length between each side of the adhesive layer and each side of the glass substrate, which correspond to each other, may be in a range equal to or greater than about 0.00 mm and equal to or smaller than about 1.00 mm.

A side edge of the polymer film may overlap a side edge of the protective layer.

The glass substrate may include the other surface spaced apart from the one surface, and the adhesive layer may be disposed adjacent to the other surface of the glass substrate.

The glass substrate may include the other surface spaced apart from the one surface, and the light blocking portion may be disposed on the one surface or the other surface of the glass substrate.

The light blocking portion may be disposed on one surface of the polymer film, which is disposed adjacent to the adhesive layer.

The polymer film and the protective layer may be provided to be spaced apart from each other with the light blocking portion interposed therebetween.

The glass substrate may include the other surface spaced apart from the one surface, and a step difference may be defined by the side surface of the adhesive layer and the other surface of the glass substrate.

The protective layer may include at least one of a silicone resin, an epoxy resin, a polyurethane resin, and a polyimide resin.

The polymer film may include at least one of polyimide, polyethylene terephthalate, polyurethane, and poly methyl methacrylate.

According to another aspect of the invention, a display device includes: a display panel including at least one folding area and a cover window disposed on the display panel. The cover window includes a glass substrate, a polymer film disposed on the glass substrate, an adhesive layer disposed between the glass substrate and the polymer film, a protective layer covering a side surface of the adhesive layer, a side surface of the glass substrate, and one surface of the glass substrate, and a light blocking portion disposed on at least one of the glass substrate and the polymer film.

The display device may further include a case to accommodate the display panel and the cover window. The protective layer may include a side surface protective portion covering the side surface of the adhesive layer and the side surface of the glass substrate and a lower surface protective portion covering the one surface of the glass substrate, and the side surface protective portion may be disposed adjacent to a side surface of the case.

The side surface of the adhesive layer and the case may be provided to be spaced apart from each other with the side surface protective portion interposed therebetween.

The polymer film may be disposed on a front surface of the display device.

The adhesive layer may be disposed directly between the glass substrate and the polymer film.

According to still another aspect of the invention, a method of manufacturing a display device includes providing a cover window on a display panel. The step of providing the cover window includes the steps of providing an adhesive layer on a glass substrate, providing a preliminary polymer film on the adhesive layer to allow the preliminary polymer film to be spaced apart from the glass substrate, providing a preliminary protective layer to be disposed adjacent to a side surface of the adhesive layer and to cover one surface of the glass substrate, removing an edge of the preliminary protective layer and an edge of the preliminary polymer film to form a protective layer and a polymer film of the cover window, and disposing the cover window such that the protective layer is disposed closer to the display panel than the polymer film is.

The step of providing the preliminary protective layer may include the step of providing the preliminary protective layer directly on the side surface of the adhesive layer and the one surface of the glass substrate.

The polymer film may have an area greater than an area of the glass substrate in a plan.

The step of forming the protective layer and the polymer film may include the step of removing the edge of the preliminary protective layer and the edge of the preliminary polymer film such that an edge of the protective layer and an edge of the polymer film coincide with each other in position.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a cover window, a display device including the cover window, and a method of manufacturing the display device according to an exemplary embodiment will be explained in detail with reference to the accompanying drawings.

Figure 1:
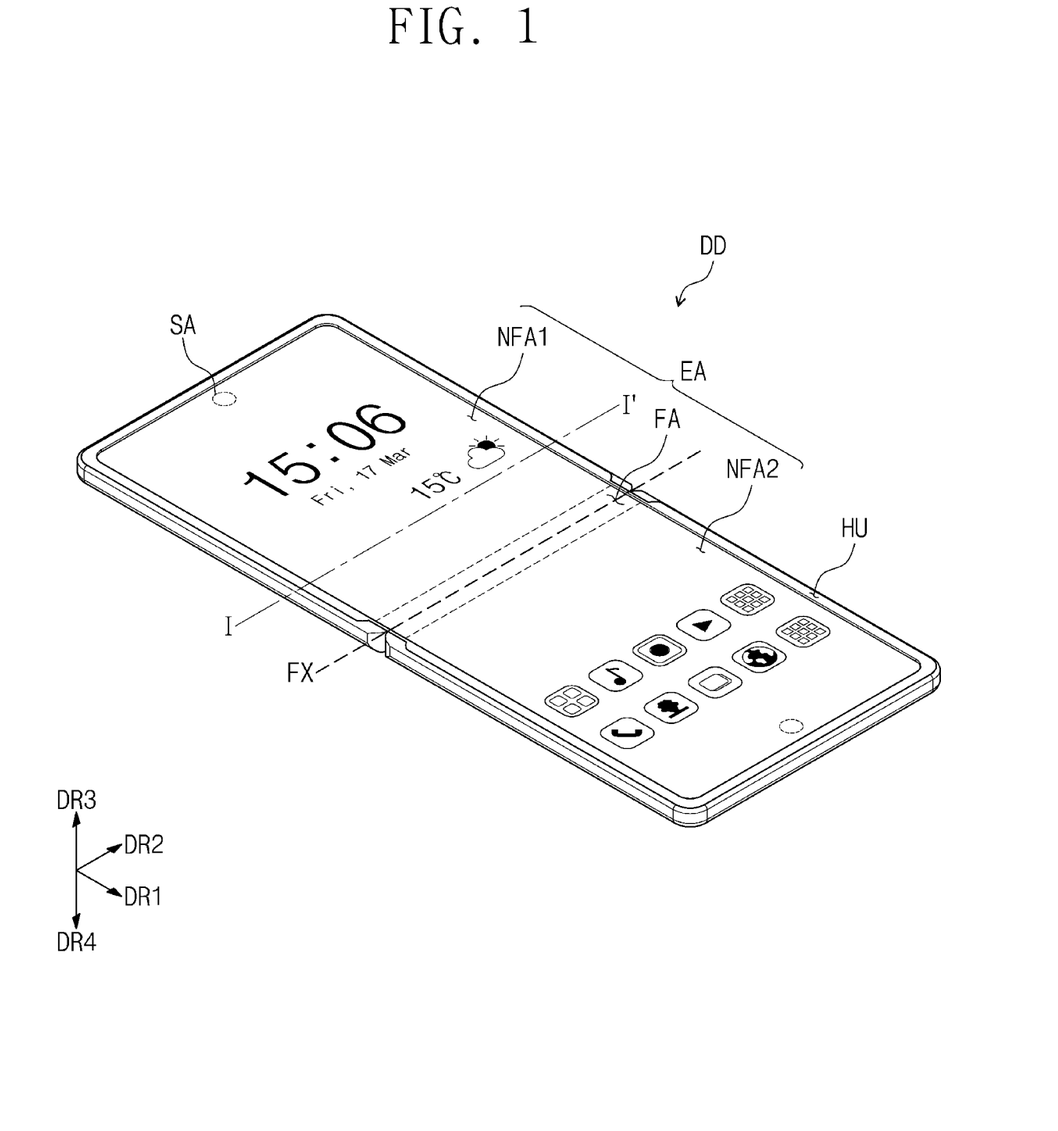
FIG. 1 is a perspective view of an exemplary embodiment of a display device constructed according to the principles of the invention shown in an unfolded state.
Figure 2:
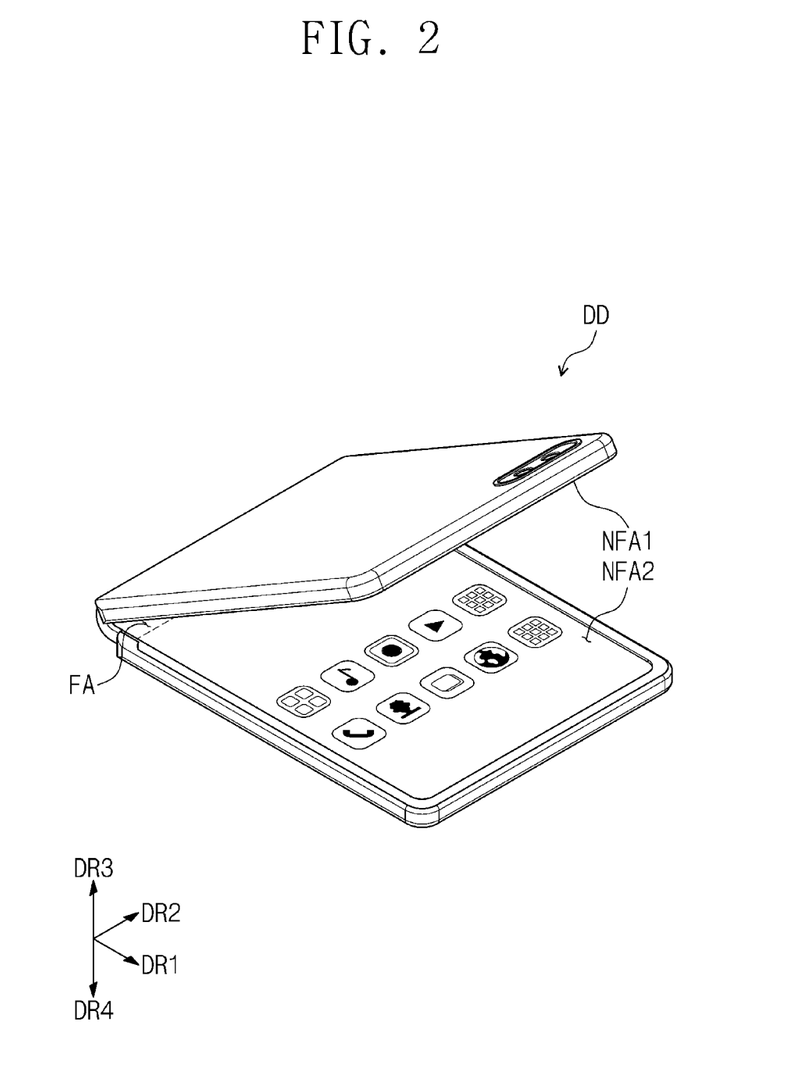
FIG. 2 is a perspective view of an exemplary embodiment of a display device constructed according to the principles of the invention shown in a folded state.

FIG. 1 is a perspective view of an exemplary embodiment of a display device constructed according to the principles of the invention shown in an unfolded state, and FIG. 2 is a perspective view of an exemplary embodiment of a display device constructed according to the principles of the invention shown in a folded state. The display device DD according to the exemplary embodiment may be a flexible display device that is foldable or bendable or is maintained in a folded state or bent state.

Referring to FIGS. 1 and 2, the display device DD may be a device that is activated in response to electrical signals. The display device DD may be a personal digital assistant, a tablet computer, a car navigation unit, a game unit, or a wearable device, however, it should not be limited thereto or thereby. FIGS. 1 and 2 show a portable electronic device as a representative example of the display device DD.

The display device DD may display an image through an active area EA. The active area EA may include non-folding areas NFA1 and NFA2 and a folding area FA. The folding area FA may be folded about a folding axis FX substantially parallel to a direction in which a second directional axis DR2 extends.

When the display device DD is folded, the non-folding areas NFA1 and NFA2 may face each other. Accordingly, when the display device DD is fully folded, the active area EA may not be exposed to the outside, and this folded state may be referred to as an "in-folding". However, this is merely exemplary, and an operation of the display device DD should not be limited thereto or thereby.

The display device DD may perform only one of in-folding and out-folding operations. As another way, the display device DD may perform both the in-folding and out-folding operations. In this case, a specific area, e.g., the folding area FA, of the display device DD may be inwardly folded (in-folding) or outwardly folded (out-folding). As another way, a portion of the display device DD may be inwardly folded (in-folding), and the other portion of the display device DD may be outwardly folded (out-folding).

FIGS. 1 and 2 show one folding area FA and two non-folding areas NFA1 and NFA2 as a representative example, however, the number of the folding areas and the number of the non-folding areas should not be limited thereto or thereby. For example, the display device DD may include three or more non-folding areas and a plurality of folding areas disposed between the non-folding areas adjacent to each other.

FIGS. 1 and 2 show the display device DD in which the folding axis FX is substantially parallel to a short axis of the display device DD, however, the exemplary embodiments should not be limited thereto or thereby. For example, the folding axis FX may be substantially parallel to a long axis of the display device DD, i.e., a direction in which a first directional axis DR1 extends.

The display device DD may include a sensing area SA surrounded by the active area EA. For example, the sensing area SA may overlap a camera module. FIG. 1 shows one sensing area SA, however, the exemplary embodiment should not be limited thereto or thereby. The display device may include a plurality of sensing areas.

The display device DD may include a case HU. The case HU may accommodate a display panel DP and a cover window CW therein.

Figure 3:
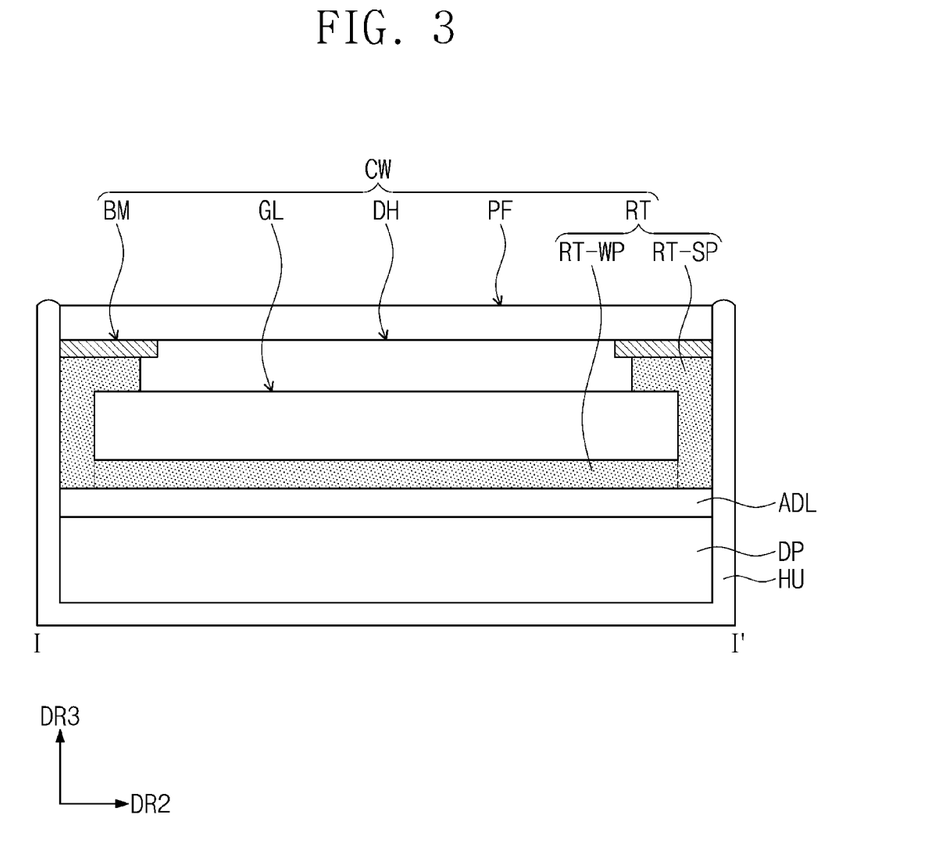
FIG. 3 is a cross-sectional view taken along a line I-I' of FIG. 1.

FIG. 3 is a cross-sectional view taken along a line I-I' of FIG. 1. The display device DD may include the display panel DP, an adhesive auxiliary layer ADL, and the cover window CW. The adhesive auxiliary layer ADL may be disposed between the display panel DP and the cover window CW. The display panel DP and the cover window CW may be coupled to each other by the adhesive auxiliary layer ADL.

The adhesive auxiliary layer ADL may be provided to attach the cover window CW onto the display panel DP. The adhesive auxiliary layer ADL may be a transparent adhesive layer, such as a pressure sensitive adhesive (PSA) film, an optically clear adhesive (OCA) film, or an optically clear resin (OCR). However, the exemplary embodiment should not be limited thereto or thereby, and the adhesive auxiliary layer ADL may be omitted.

The cover window CW may include a glass substrate GL, an adhesive layer DH, a polymer film PF, a protective layer RT, and a light blocking portion BM. The cover window CW disposed above the display panel DP may be disposed such that the protective layer RT of the cover window CW is disposed adjacent to the display panel DP.

Figure 4:
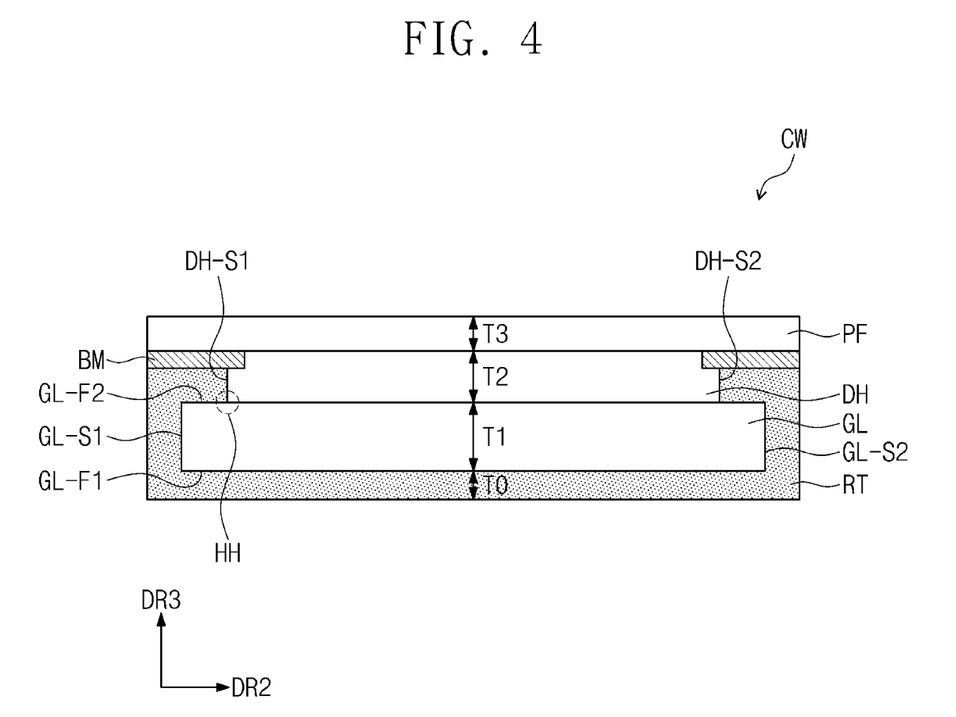
FIG. 4 is a cross-sectional view of an exemplary embodiment of the cover window of FIG. 3.
Figure 5:
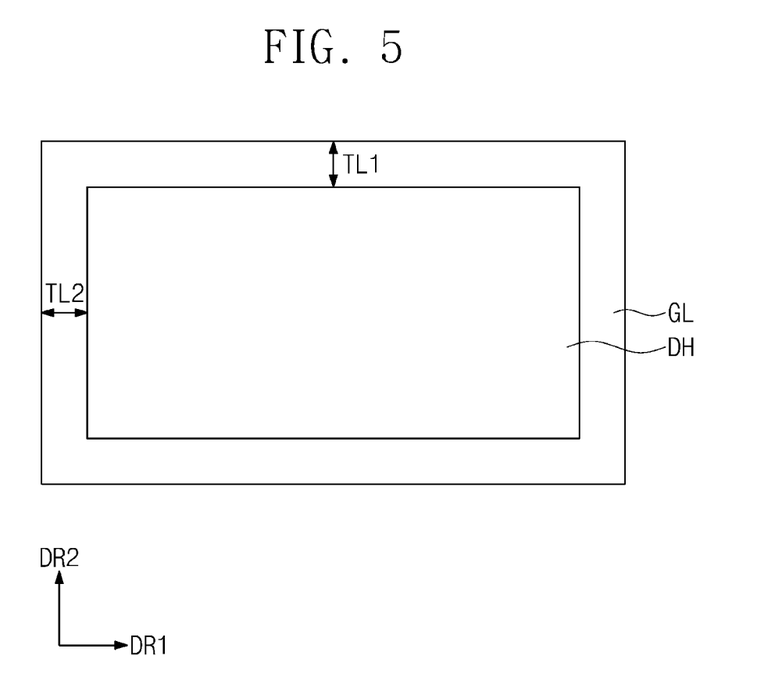
FIG. 5 is a plan view of an exemplary embodiment of the glass substrate and the adhesive layer of FIG. 3.
Figure 6:
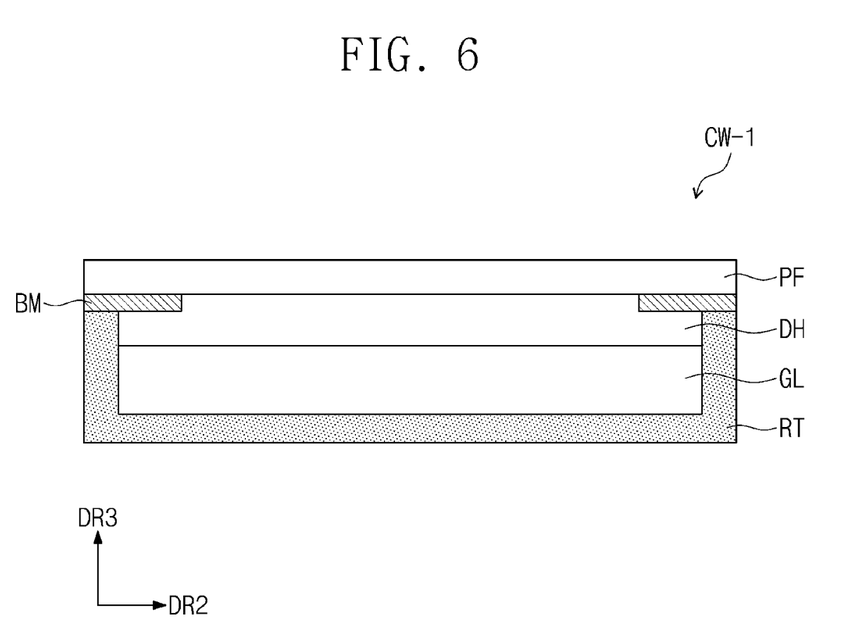
FIG. 6 is a cross-sectional view of another exemplary embodiment of the cover window of FIG. 3.
Figure 7:
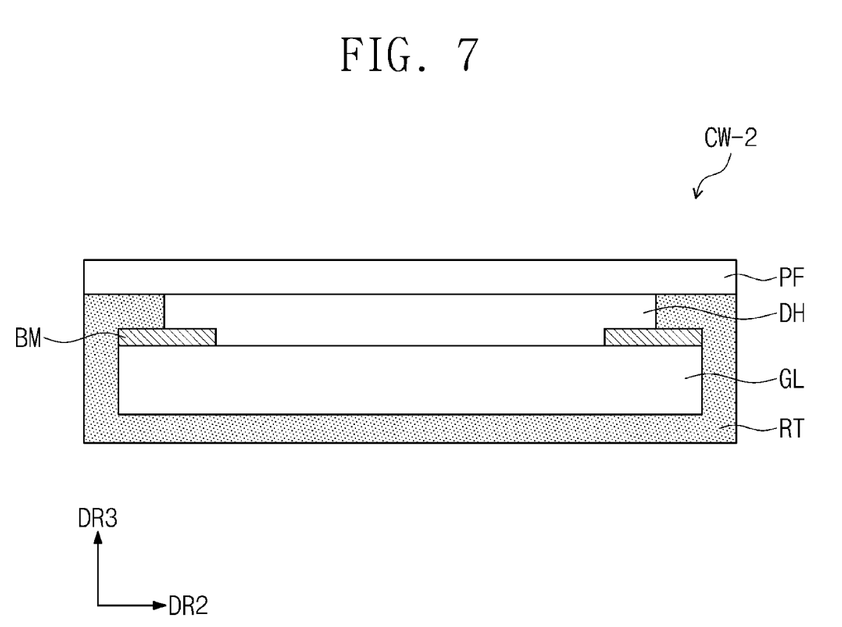
FIG. 7 is a cross-sectional view of still another exemplary embodiment of the cover window of FIG. 3.

FIG. 4 is a cross-sectional view of an exemplary embodiment of the cover window CW of FIG. 3. FIG. 5 is a plan view of an exemplary embodiment of the glass substrate and the adhesive layer of FIG. 3. FIGS. 6 and 7 are cross-sectional views of other exemplary embodiments of the cover window CW-1 and CW-2 of FIG. 3.

The cover windows CW, CW-1, and CW-2 may include the glass substrate GL, the adhesive layer DH, the polymer film PF, the protective layer RT, and the light blocking portion BM. The polymer film PF may be disposed on the glass substrate GL. The adhesive layer DH may be disposed between the glass substrate GL and the polymer film PF. Referring to FIG. 4, the glass substrate GL, the adhesive layer DH, and the polymer film PF may be sequentially stacked one on another in a direction in which a third directional axis DR3 extends.

The glass substrate GL may have a thickness T1 equal to or greater than about 10 micrometers and equal to or smaller than about 80 micrometers. The glass substrate GL may be a tempered glass. The glass substrate GL may include one surface GL-F1 and the other surface GL-F2 spaced apart from the one surface GL-F1. The one surface GL-F1 and the other surface GL-F2 of the glass substrate GL may be spaced apart from each other in the direction in which the third directional axis DR3 extends. Each of the one surface GL-F1 of the glass substrate GL and the other surface GL-F2 of the glass substrate GL may be substantially parallel to the direction in which the second directional axis DR2 extends. The one surface GL-F1 of the glass substrate GL and the other surface GL-F2 of the glass substrate GL may be connected to each other by side surfaces GL-S1 and GL-S2 of the glass substrate GL. The side surfaces GL-S1 and GL-S2 of the glass substrate GL may be substantially parallel to the direction in which the third directional axis DR3 extends.

The adhesive layer DH may be disposed on the glass substrate GL. The adhesive layer DH may be disposed directly on the other surface GL-F2 of the glass substrate GL. The adhesive layer DH may be disposed directly between the glass substrate GL and the polymer film PF. The adhesive layer DH may couple the glass substrate GL and the polymer film PF.

The adhesive layer DH may have a thickness T2 equal to or greater than about 5 micrometers and equal to or smaller than about 100 micrometers. The adhesive layer DH may be transparent. For example, the adhesive layer DH may be a transparent adhesive layer, such as a pressure sensitive adhesive (PSA) film, an optically clear adhesive (OCA) film, or an optically clear resin (OCR).

The adhesive layer DH may entirely overlap the glass substrate GL. One surface of the adhesive layer DH may overlap the glass substrate GL. The adhesive layer DH may have an area equal to or smaller than an area of the glass substrate GL when viewed in a plan. When viewed in a plan view, the area of the adhesive layer DH may be equal to the area of the glass substrate GL, or the area of the adhesive layer DH may be smaller than the area of the glass substrate GL. Each of the adhesive layer DH and the glass substrate GL may have a quadrangular shape when viewed in a plan, and the area of the adhesive layer DH may be equal to or smaller than the area of the glass substrate GL.

Referring to FIG. 5, a difference TL1, TL2 in length between each side of the adhesive layer DH and each side of the glass substrate GL, which correspond to each other, may be equal to or greater than about 0.00 mm and equal to or smaller than about 1.00 mm. The difference TL1 in length between a side of the adhesive layer DH and a side of the glass substrate GL, which are substantially parallel to each other in the direction in which the second directional axis DR2 extends, may be equal to or greater than about 0.00 mm and equal to or smaller than about 1.00 mm. The difference TL2 in length between a side of the adhesive layer DH and a side of the glass substrate GL, which are substantially parallel to each other in the direction in which the first directional axis DR1 extends, may be equal to or greater than about 0.00 mm and equal to or smaller than about 1.00 mm. The length of each side of the adhesive layer DH may be shorter than the length of each side of the glass substrate GL, which correspond to each other. The length of each side of the adhesive layer DH may be shorter than corresponding each side of the glass substrate GL by the length equal to or greater than about 0.00 mm and equal to or smaller than about 1.00 mm.

For example, the difference TL1, TL2 in length between each side of the adhesive layer DH and each side of the glass substrate GL, which corresponds to the side of the adhesive layer DH, may be equal to or greater than about 0.05 mm and equal to or smaller than about 0.34 mm. The difference TL1 in length between the side of the adhesive layer DH and the side of the glass substrate GL, which are substantially parallel to each other in the direction in which the second directional axis DR2 extends, may be equal to or greater than about 0.05 mm and equal to or smaller than about 0.34 mm. The difference TL2 in length between the side of the adhesive layer DH and the side of the glass substrate GL, which are substantially parallel to each other in the direction in which the first directional axis DR1 extends, may be equal to or greater than about 0.05 mm and equal to or smaller than about 0.34 mm. However, this is merely exemplary, and the exemplary embodiments should not be limited thereto or thereby.

Each of the adhesive layer DH and the glass substrate GL shown in FIG. 5 has a rectangular shape defined by two short sides and two long sides, however, the shape of the adhesive layer DH and the glass substrate GL should not be limited thereto or thereby.

A difference in length between four sides of the adhesive layer DH and four sides of the glass substrate GL, which respectively correspond to the four sides of the adhesive layer DH, may be constant. The difference TL2 in length between the short side of the adhesive layer DH and the short side of the glass substrate GL, which corresponds to the short side of the adhesive layer DH, may be equal to the difference TL1 in length between the long side of the adhesive layer DH and the long side of the glass substrate GL, which corresponds to the long side of the adhesive layer DH. As another way, a difference in length between four sides of the adhesive layer DH and four sides of the glass substrate GL, which respectively correspond to the four sides of the adhesive layer DH, may be different. The difference TL2 in length between the short side of the adhesive layer DH and the short side of the glass substrate GL, which corresponds to the short side of the adhesive layer DH, may be smaller than the difference TL1 in length between the long side of the adhesive layer DH and the long side of the glass substrate GL, which corresponds to the long side of the adhesive layer DH. According to another embodiment, the difference TL2 in length between the short side of the adhesive layer DH and the short side of the glass substrate GL, which corresponds to the short side of the adhesive layer DH, may be greater than the difference TL1 in length between the long side of the adhesive layer DH and the long side of the glass substrate GL, which corresponds to the long side of the adhesive layer DH.

Referring to FIGS. 4 and 5, when the area of the adhesive layer DH is smaller than the area of the glass substrate GL when viewed in a plan, as shown in FIG. 4, a step difference HH may be defined by the side surfaces DH-S1 and DH-S2 of the adhesive layer DH and the other surface GL-F2 of the glass substrate GL. The other surface GL-F2 of the glass substrate GL may be in contact with the adhesive layer DH. The area of the adhesive layer DH may be smaller than the area of the glass substrate GL, and a portion of the other surface GL-F2 of the glass substrate GL may not overlap the adhesive layer DH. The side surfaces DH-S1 and DH-S2 of the adhesive layer DH may not overlap the side surfaces GL-S1 and GL-S2 of the glass substrate GL. Accordingly, the step difference HH may be formed by the side surfaces DH-S1 and DH-S2 of the adhesive layer DH and the other surface GL-F2 of the glass substrate GL, however, the exemplary embodiment should not be limited thereto or thereby. That is, when the area of the adhesive layer DH is equal to the area of the glass substrate GL when viewed in the plan, the step difference HH may not be formed.

Different from the cover windows CW of FIG. 4 and CW-2 of FIG. 7, the area of the glass substrate GL and the area of the adhesive layer DH are the same as each other in the cover window CW-1 shown in FIG. 6. The area of the glass substrate GL and the area of the adhesive layer DH may be the same as each other in the plan. Each of the glass substrate GL and the adhesive layer DH may have a quadrangular shape in the plan, and a length of each side of the glass substrate GL may be equal to a length of a corresponding side of sides of the adhesive layer DH.

Referring to FIG. 4 again, the polymer film PF may be disposed on the adhesive layer DH. The polymer film PF may have a thickness T3 equal to or greater than about 10 micrometers and equal to or smaller than about 80 micrometers. The polymer film PF may include at least one of polyimide, polyethylene terephthalate, polyurethane, and poly methyl methacrylate. However, this is merely exemplary, and a material for the polymer film PF should not be limited thereto or thereby. The polymer film PF may include a material having a transparent property.

The polymer film PF may be disposed on a front surface of the display panel DP. The polymer film PF may transmit the image provided thereto from the display panel DP and may protect the glass substrate GL from external impacts. The polymer film PF may contribute to improving a front strength of the glass substrate GL. The area of the polymer film PF may be greater than the area of the glass substrate GL when viewed in a plan. Accordingly, when a coating process is performed to form the protective layer RT, it is possible to prevent a coating solution from permeating into the front surface of the glass substrate GL. The polymer film PF having the area greater than the area of the glass substrate GL in the plan may contribute to improving the manufacturing yield of the cover windows CW, CW-1, and CW-2.

Since the cover windows CW, CW-1, and CW-2 include the glass substrate GL and the polymer film PF, the cover windows CW, CW-1, and CW-2 may have properties of the glass substrate GL and the polymer film PF. For example, the cover windows CW, CW-1, and CW-2 may have the transparent property of the glass substrate GL and the flexible property of the polymer film PF.

The light blocking portion BM may be disposed on at least one of the glass substrate GL and the polymer film PF. FIGS. 4 and 6 show the cover windows CW and CW-1 including the light blocking portion BM disposed on the polymer film PF. Different from the above, FIG. 7 shows the cover window CW-2 including the light blocking portion BM disposed on the glass substrate GL. The light blocking portion BM may be formed by using an organic light blocking material or an inorganic light blocking material, which includes a black pigment or dye. However, the exemplary embodiment should not be limited thereto or thereby, and the light blocking portion BM may have other colors instead of the black color.

Referring to FIGS. 4 and 6, the light blocking portion BM may be disposed under the polymer film PF. The light blocking portion BM may be disposed on a rear surface of the polymer film PF. A front surface of the polymer film PF may overlap the active area EA (refer to FIG. 1) of the display device DD. The rear surface of the polymer film PF may be spaced apart from the front surface of the polymer film PF. The rear surface of the polymer film PF may be in contact with the adhesive layer DH. The light blocking portion BM may be disposed on the rear surface of the polymer film PF, which is spaced apart from the front surface of the polymer film PF. When the light blocking portion BM is disposed under the polymer film PF, the polymer film PF may be spaced apart from the protective layer RT with the light blocking portion BM interposed therebetween.

The light blocking portion BM may be disposed on the glass substrate GL. The light blocking portion BM may be disposed on or under the glass substrate GL. In FIG. 7, the light blocking portion BM is disposed on the glass substrate GL and disposed adjacent to the adhesive layer DH. Although not shown in figures, the light blocking portion BM may be disposed under the glass substrate GL. The light blocking portion BM disposed under the glass substrate GL may be spaced apart from the adhesive layer DH. The adhesive layer DH may be disposed on the other surface GL-F2 of the glass substrate GL, and the light blocking portion BM may be disposed on the one surface GL-F1 of the glass substrate GL. The light blocking portion BM and the adhesive layer DH may be spaced apart from each other with the glass substrate GL interposed therebetween.

The protective layer RT may have a thickness TO equal to or greater than about 1 micrometers and equal to or smaller than about 10 micrometers. The protective layer RT may include at least one of a silicone resin, an epoxy resin, a polyurethane resin, and a polyimide resin. However, this is merely exemplary, and a material for the protective layer RT should not be limited thereto or thereby. The protective layer RT may include a polymer resin with a transparent property.

The protective layer RT may cover the adhesive layer DH and the glass substrate GL. According to an embodiment, the protective layer RT may cover the side surfaces DH-S1 and DH-S2 of the adhesive layer DH, the side surfaces GL-S1 and GL-S2 of the glass substrate GL, and the one surface GL-F1 of the glass substrate GL. When the area of the adhesive layer DH is smaller than the area of the glass substrate GL in a plan, the protective layer RT may cover a portion of the other surface GL-F2 of the glass substrate GL where the adhesive layer DH is not disposed.

Referring to FIG. 3, the protective layer RT may include a side surface protective portion RT-SP (refer to FIG. 3) and a lower surface protective portion RT-WP (refer to FIG. 3). The side surface protective portion RT-SP of the protective layer RT may cover the side surfaces DH-S1 and DH-S2 of the adhesive layer DH and the side surfaces GL-S1 and GL-S2 of the glass substrate GL. The lower surface protective portion RT-WP of the protective layer RT may cover the one surface GL-F1 of the glass substrate GL. The side surface protective portion RT-SP of the protective layer RT may be adjacent to a side surface of the case HU. The side surfaces DH-S1 and DH-S2 of the adhesive layer DH and the side surface of the case HU may be spaced apart from each other with the side surface protective portion RT-SP interposed therebetween.

A side surface edge of the protective layer RT may overlap a side surface edge of the polymer film PF. Each of the side surface edge of the protective layer RT and the side surface edge of the polymer film PF may be substantially parallel to the direction in which the third directional axis DR3 extends. That is, the side surface edge of the protective layer RT and the side surface edge of the polymer film PF may be on the same line.

The protective layer RT may protect the glass substrate GL. As described above, the glass substrate GL has a thin thickness, and a side surface of the glass substrate GL is vulnerable to external impacts. Accordingly, the protective layer RT may be provided to improve strength of the glass substrate GL. The protective layer RT may cover the one surface GL-F1 of the glass substrate GL and the side surfaces GL-S1 and GL-S2 of the glass substrate GL to prevent the glass substrate GL from being damaged due to the external impacts.

Figure 8:
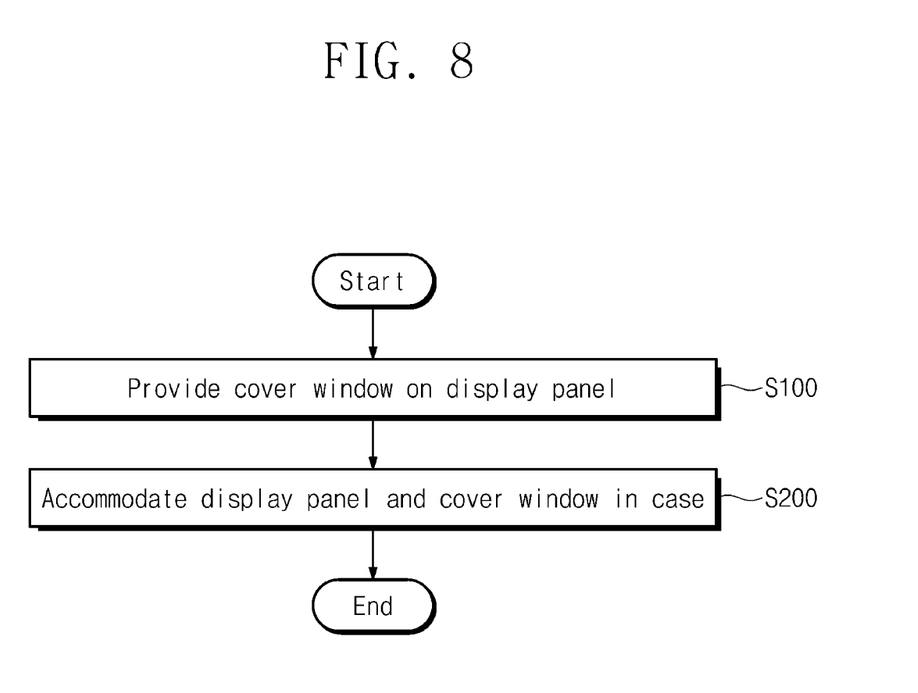
FIG. 8 is a flowchart of an exemplary embodiment of a method of manufacturing a display device according to the principles of the invention
Figure 9:
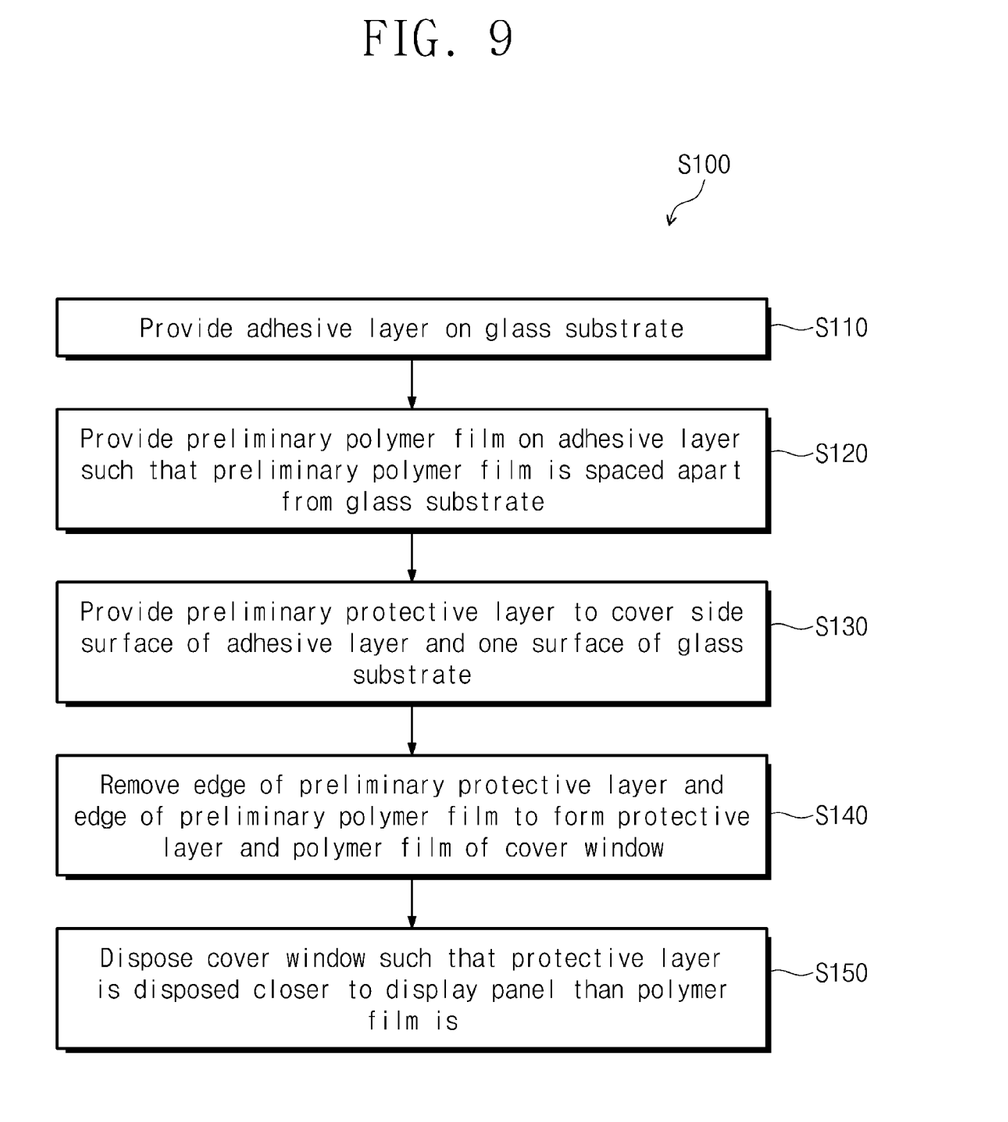
FIG. 9 is a flowchart multiple steps showing the step of providing the cover window of FIG. 8.
Figure 10:
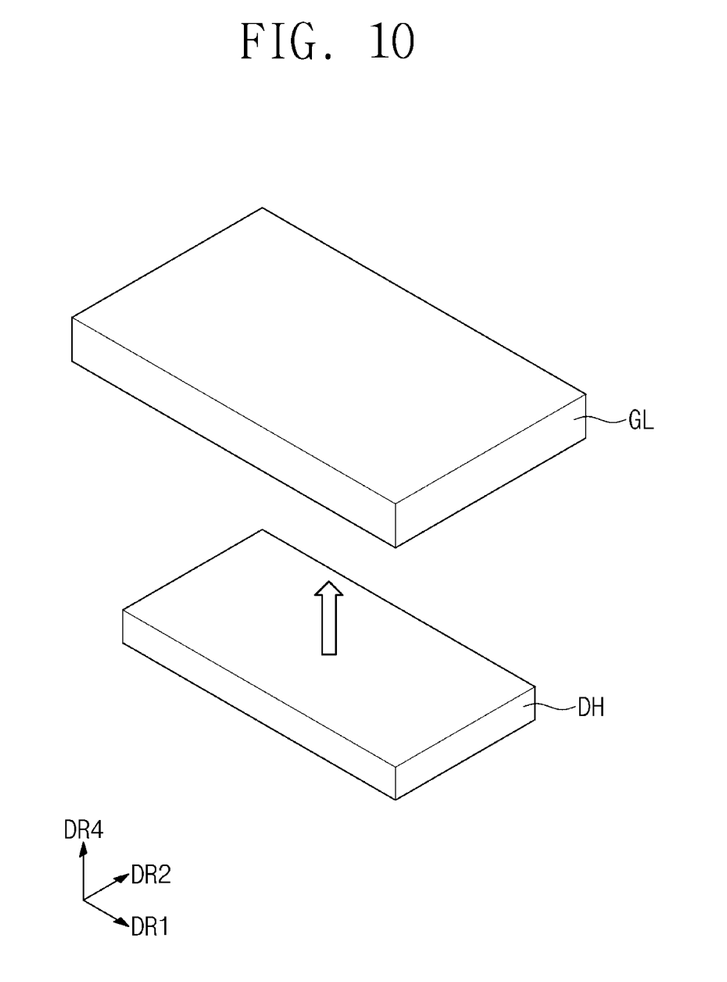
FIGS. 10 to 12 are perspective views showing corresponding to some steps in FIG. 9.
Figure 11:
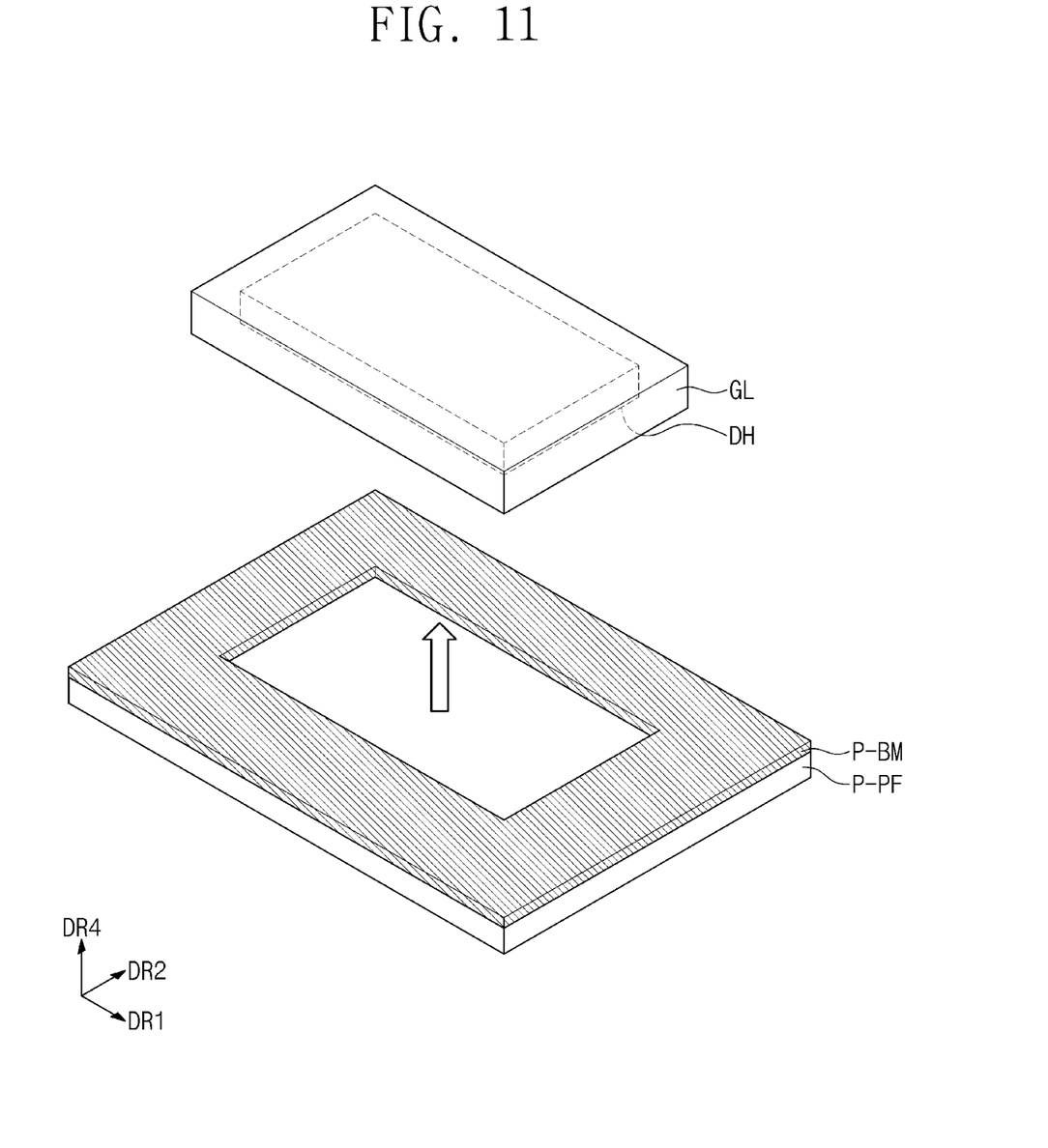
Figure 12:
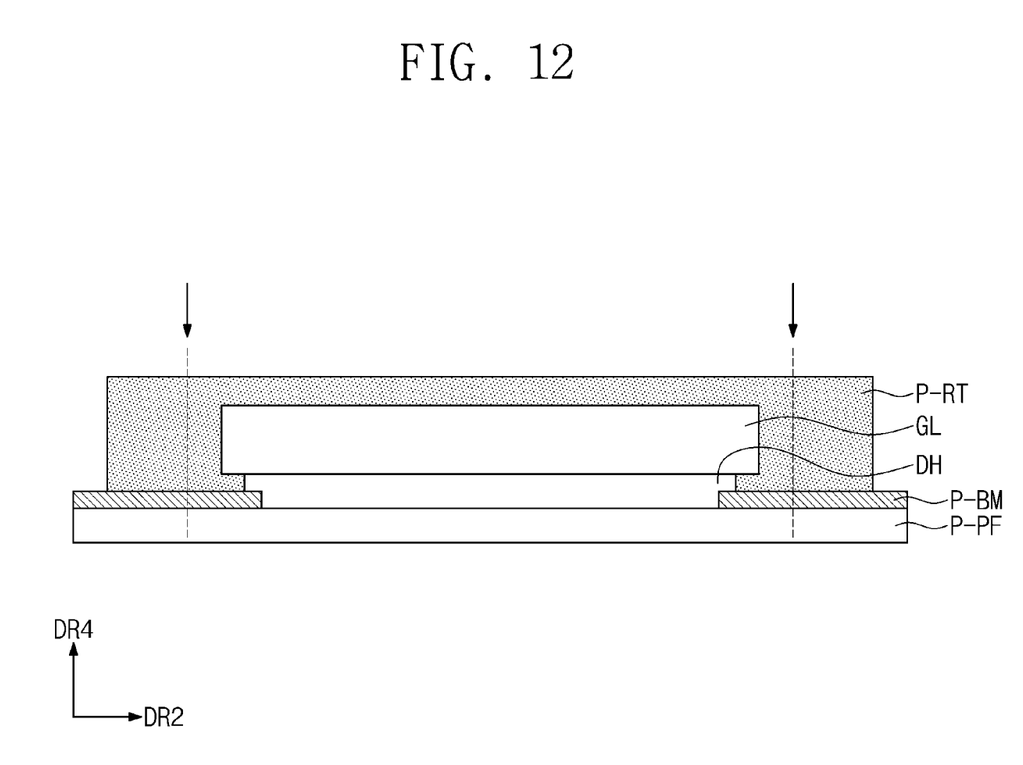

FIG. 8 is a flowchart of an exemplary embodiment of a method of manufacturing a display device according to the principles of the invention. FIG. 9 is a flowchart multiple steps showing the step of providing the cover window of FIG. 8. FIGS. 10 to 12 are perspective views showing corresponding to some steps in FIG. 9. In other words, FIGS. 10 to 12 are views showing a process of providing the cover window CW according to an exemplary embodiment. In FIGS. 10 to 12, the same reference numerals denote the same elements in FIGS. 3 to 7, and thus, detailed descriptions of the same elements will be omitted.

The manufacturing method of the display device DD may include providing the cover window CW on the display panel DP (S100) and accommodating the display panel DP and the cover window CW in the case HU (S200). The display device DD may include the display panel DP and the cover window CW. The cover window CW may include the glass substrate GL, the adhesive layer DH, the polymer film PF, and the protective layer RT. The protective layer RT may be disposed on and adjacent to the display panel DP. The cover window CW may be disposed on the display panel DP such that the protective layer RT is disposed adjacent to the display panel DP. The display device DD (refer to FIGS. 1 and 2) according to the exemplary embodiment may be manufactured by the manufacturing method of the display device. The above-mentioned cover window CW (refer to FIG. 4) may be manufactured by the manufacturing method of the display device DD.

Referring to FIG. 9, the providing of the cover window CW may include providing the adhesive layer DH on the glass substrate GL (S110), providing a preliminary polymer film P-PF on the adhesive layer DH (S120), providing a preliminary protective layer P-RT (S130), removing an edge of the preliminary protective layer P-RT and an edge of the preliminary polymer film P-PF to form the protective layer RT and the polymer film PF (S140), and disposing the cover window CW such that the protective layer RT is disposed closer to the display panel DP than the polymer film PF is (S150).

FIG. 10 shows the providing of the adhesive layer DH on the glass substrate (S110). The area of the adhesive layer DH may be equal to or smaller than the area of the glass substrate GL when viewed in a plan. In FIG. 10, each of the adhesive layer DH and the glass substrate GL may have the quadrangular shape, and the area of the adhesive layer DH may be smaller than the area of the glass substrate GL. However, this is merely exemplary, and the area of the adhesive layer DH may be equal to the area of the glass substrate GL.

The adhesive layer DH may be provided on the glass substrate GL, and then the preliminary polymer film P-PF may be provided on the adhesive layer DH. In FIG. 11, the preliminary polymer film P-PF is provided on the adhesive layer DH while a preliminary light blocking portion P-BM is disposed on the preliminary polymer film P-PF. The preliminary light blocking portion P-BM disposed on the preliminary polymer film P-PF may be formed by a printing process. An edge of the preliminary light blocking portion P-BM may overlap an edge of the preliminary polymer film P-PF. The preliminary polymer film P-PF may have an area greater than the area of the glass substrate GL when viewed in a plan. Accordingly, when the coating process is performed to form the preliminary protective layer P-RT, it is possible to prevent the coating solution from permeating into the front surface of the glass substrate GL, and the manufacturing yield of the cover window CW may be improved.

The preliminary protective layer P-RT may be disposed adjacent to the side surfaces DH-S1 and DH-S2 of the adhesive layer DH and may cover the one surface GL-F1 of the glass substrate GL. The preliminary protective layer P-RT may be formed by the coating process. For example, the preliminary protective layer P-RT may be formed by a slit coating process.

When a conventional cover window is manufactured, an adhesive layer is provided after a protective layer is formed on a side surface and one surface of a glass substrate. After a process of forming the protective layer on the glass substrate using a jig, the adhesive layer is provided, and a polymer film is provided on the adhesive layer. When the protective layer is formed on the glass substrate before the adhesive layer is formed on the glass substrate, a coating solution used to form the protective layer permeates into a front surface of the glass substrate, and as a result, a manufacturing yield of the cover window is lowered.

In addition, the adhesive layer has the same area as that of the polymer film when viewed in a plan. The polymer film entirely overlaps the adhesive layer, and a side edge of the adhesive layer and a side edge of the polymer film coincide with each other in position. As the adhesive layer is provided after the protective layer is formed, the protective layer covers only the side surface and the one surface of the glass substrate and does not cover the side surface of the adhesive layer.

According to the manufacturing method of the display device DD according to the exemplary embodiment, the preliminary protective layer P-RT may be formed after the adhesive layer DH and the preliminary polymer film P-PF are provided on the glass substrate GL. The manufacturing method of the display device DD according to the exemplary embodiment may include the providing of the cover window CW. The providing of the cover window CW may include the forming of the preliminary protective layer P-RT after performing the providing of the adhesive layer DH on the glass substrate GL and providing preliminary polymer film P-PF on the adhesive layer DH. Accordingly, it is possible to prevent the coating solution used to form the protective layer RT from permeating into the front surface of the glass substrate GL. That is, the glass substrate GL and the polymer film PF may be adhered to each other by the adhesive layer DH, and thus, it is possible to prevent the coating solution used to form the protective layer RT from permeating into the front surface of the glass substrate GL. Therefore, the manufacturing yield of the display device DD may be improved.

FIG. 12 shows a process of removing the edge of the preliminary protective layer P-RT and the edge of the preliminary polymer film P-PF after the preliminary protective layer P-RT is provided. The protective layer RT shown in FIG. 4 may be formed by removing the edge of the preliminary protective layer P-RT, and the polymer film PF shown in FIG. 4 may be formed by removing the edge of the preliminary polymer film P-PF. The edge of the preliminary protective layer P-RT and the edge of the preliminary polymer film P-PF may be removed such that the edge of the protective layer RT and the edge of the polymer film PF coincide with each other in position through the removing of the edge of each of the preliminary protective layer P-RT and the preliminary polymer film P-PF (S140). The edge of the preliminary light blocking portion P-BM disposed on the preliminary polymer film P-PF may be removed together with the edge of the preliminary polymer film P-PF. The edge of the light blocking portion BM formed from the preliminary light blocking portion P-BM may be coincide with the edge of the polymer film PF in position.

Then, as shown in FIG. 3, the cover window CW on which the protective layer RT and the polymer film PF are formed may be disposed on the display panel DP. As described above, the cover window CW may be provided on the display panel DP such that the protective layer RT of the cover window CW is disposed adjacent to the display panel DP. The cover window CW may be provided on the display panel DP such that the protective layer RT of the cover window CW is disposed closer to the display panel DP than the polymer film PF of the cover window CW is. That is, the protective layer RT may be disposed closer to the display panel DP than the polymer film PF is.

The cover window according to the exemplary embodiment may include the glass substrate, the adhesive layer, the polymer film, and the protective layer. The polymer film may be disposed on the glass substrate, and the adhesive layer may be disposed between the glass substrate and the polymer film. The protective layer may cover the side surface of the adhesive layer, the side surface of the glass substrate, and the one surface of the glass substrate, and thus, the protective layer may contribute to improving the strength of the side surface of the glass substrate. The polymer film may contribute to improving the strength of the front surface of the glass substrate. Accordingly, the reliability of the cover window may be improved. In addition, as the cover window may include the glass substrate and the polymer film, the cover window may have the transparent property of the glass substrate and the flexible property of the polymer film.

The display device according to the exemplary embodiment may include the cover window, and the polymer film of the cover window may be disposed on the front surface of the display device. Accordingly, the display device according to the exemplary embodiment may have the improved strength on the front surface thereof.

The manufacturing method of the display device according to the exemplary embodiment may include the providing of the cover window, and the protective layer of the cover window may be formed after the glass substrate, the adhesive layer, and the polymer film are formed. Therefore, the coating solution used to form the protective layer may be prevented from permeating into the front surface of the glass substrate, and thus, the manufacturing yield of the cover window may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A cover window comprising:
   a glass substrate having a first area;
   a polymer film disposed on the glass substrate and having a second area greater than the first area;
   an adhesive layer disposed between the glass substrate and the polymer film;
   a protective layer covering a side surface of the adhesive layer, a side surface of the glass substrate, and one surface of the glass substrate; and
   a light blocking portion disposed on at least one of the glass substrate and the polymer film.

2. The cover window of claim 1, wherein the adhesive layer entirely overlaps the glass substrate, and the adhesive layer has an area equal to or smaller than an area of the glass substrate in a plan view.

3. The cover window of claim 1, wherein each of the adhesive layer and the glass substrate has a quadrangular shape in a plan view, the adhesive layer has an area equal to or smaller than an area of the glass substrate in the plan view, and
   a difference in length between each side of the adhesive layer and each side of the glass substrate, which correspond to each other, is in a range equal to or greater than about 0.00 mm and equal to or smaller than about 1.00 mm.

4. The cover window of claim 1, wherein a side edge of the polymer film overlaps a side edge of the protective layer.

5. The cover window of claim 1, wherein the glass substrate comprises the other surface spaced apart from the one surface, and the adhesive layer is disposed adjacent to the other surface of the glass substrate.

6. The cover window of claim 1, wherein the glass substrate comprises the other surface spaced apart from the one surface, and
   the light blocking portion is disposed on the one surface or the other surface of the glass substrate.

7. The cover window of claim 1, wherein the light blocking portion is disposed on one surface of the polymer film, which is disposed adjacent to the adhesive layer.

8. The cover window of claim 7, wherein the polymer film and the protective layer are provided to be spaced apart from each other with the light blocking portion interposed therebetween.

9. The cover window of claim 1, wherein the glass substrate comprises the other surface spaced apart from the one surface, and a step difference is defined by the side surface of the adhesive layer and the other surface of the glass substrate.

10. The cover window of claim 1, wherein the protective layer comprises at least one of a silicone resin, an epoxy resin, a polyurethane resin, and a polyimide resin.

11. The cover window of claim 1, wherein the polymer film comprises at least one of polyimide, polyethylene terephthalate, polyurethane, and poly methyl methacrylate.

12. A display device comprising:
   a display panel comprising at least one folding area; and
   a cover window disposed on the display panel, the cover window comprising:
   a glass substrate;
   a polymer film disposed on the glass substrate;
   an adhesive layer disposed between the glass substrate and the polymer film;
   a protective layer covering a side surface of the adhesive layer, a side surface of the glass substrate, and one surface of the glass substrate; and
   a light blocking portion disposed on at least one of the glass substrate and the polymer film.

13. The display device of claim 12, further comprising a case to accommodate the display panel and the cover window,
   wherein the protective layer comprises:
   a side surface protective portion covering the side surface of the adhesive layer and the side surface of the glass substrate; and
   a lower surface protective portion covering the one surface of the glass substrate, and
   the side surface protective portion is disposed adjacent to a side surface of the case.

14. The display device of claim 13, wherein the side surface of the adhesive layer and the case are provided to be spaced apart from each other with the side surface protective portion interposed therebetween.

15. The display device of claim 12, wherein the polymer film is disposed on a front surface of the display device.

16. The display device of claim 12, wherein the adhesive layer is disposed directly between the glass substrate and the polymer film.

17. A method of manufacturing a display device, comprising:
   providing a cover window on a display panel,
   wherein the step of providing the cover window comprising the steps of:
   providing an adhesive layer on a glass substrate;
   providing a preliminary polymer film on the adhesive layer to allow the preliminary polymer film to be spaced apart from the glass substrate;
   providing a preliminary protective layer to be disposed adjacent to a side surface of the adhesive layer and to cover one surface of the glass substrate;
   removing an edge of the preliminary protective layer and an edge of the preliminary polymer film to form a protective layer and a polymer film of the cover window; and
   disposing the cover window such that the protective layer is disposed closer to the display panel than the polymer film is.

18. The method of claim 17, wherein the step of providing the preliminary protective layer comprises the step of providing the preliminary protective layer directly on the side surface of the adhesive layer and the one surface of the glass substrate.

19. The method of claim 17, wherein the polymer film has an area greater than an area of the glass substrate in a plan.

20. The method of claim 17, wherein the step of forming the protective layer and the polymer film comprises the step of removing the edge of the preliminary protective layer and the edge of the preliminary polymer film such that an edge of the protective layer and an edge of the polymer film coincide with each other in position.

* * * * *